United States Patent [19]

Amemiya et al.

[11] 4,414,557

[45] Nov. 8, 1983

[54] BIPOLAR TRANSISTORS

[75] Inventors: Yoshihito Amemiya, Fuchu; Tsuneo Urisu, Tokorozawa; Yoshihiko Mizushima, Fuch, all of Japan

[73] Assignee: Nippon Telegraph & Telephone Public Corporation, Tokyo, Japan

[21] Appl. No.: 240,148

[22] Filed: Mar. 3, 1981

[30] Foreign Application Priority Data

Mar. 10, 1980 [JP] Japan .................................. 55-30096

[51] Int. Cl.$^3$ .................. H01L 29/161; H01L 29/80; H01L 45/00; H01L 29/72
[52] U.S. Cl. ........................................ 357/16; 357/22; 357/2; 357/89; 357/34
[58] Field of Search ...................... 357/22, 16, 2, 34, 89

[56] References Cited

U.S. PATENT DOCUMENTS

| | | | |
|---|---|---|---|
| 3,780,359 | 12/1973 | Dumke et al. | 357/16 |
| 4,062,034 | 12/1977 | Matsushita et al. | 357/16 |
| 4,160,258 | 7/1979 | Dawson et al. | 357/16 |
| 4,169,269 | 9/1979 | Aoki et al. | 357/89 X |
| 4,254,429 | 3/1981 | Yamazaki | 357/2 X |

FOREIGN PATENT DOCUMENTS 50-128697  4/1977  Japan .................................. 357/16

OTHER PUBLICATIONS

Ebers, J. J.; Moll, J. L.; *Proc. IRE*, vol. 42, p. 1761 (1954).
Iwasaki, H.; Ozawa, O.; Sasaki, T.; *Proc. 9th Cour. Solid State Devices*, Tokyo, 1977, Suppl. to Japan J. Appl. Phys., vol. 17-1, p. 245 (1978).
Matsushita, T.; Oh-uchi, N.; Hayashi, H.; Yamoto, H.; *Appl. Phys. Lett.*, vol. 35, pp. 549-550 (Oct. 1979).
Nishizawa, J.; Ohmi, T.; Mochida, Y.; Matsuyama, T.; Iida, S.; *Int. Electron Devices Mtg.*, p. 676 (1978).
Sudo, T.; Kodama, H.; Suzuki, T.; Mizushima, Y.; *Trans. IECE of Japan*, 55-6, No. 11, p. 565, (1972).

*Primary Examiner*—Martin H. Edlow
*Assistant Examiner*—J. L. Badgett
*Attorney, Agent, or Firm*—Blakely, Sokoloff, Taylor & Zafman

[57] ABSTRACT

A base region and a collector region of a bipolar transistor are interconnected through a hetero junction and forbidden band gap of the collector region is larger than that of the base region. When the transistor is made of a silicon base material, the collector region is made of oxygen containing polycrystalline silicon or amorphous silicon, whereas when made of a GaAs base alloy, the collector region is made of a mixed crystal of GaAs-AlAs.

10 Claims, 10 Drawing Figures

BIPOLAR TRANSISTORS

BACKGROUND OF THE INVENTION

This invention relates to a bipolar transistor, more particularly a power bipolar transistor.

With recent trend of rationalization and automation of various industrial installations, electronization thereof has been enhanced.

In power supplies of an electronic computer, and in such control apparatus as a motor control device utilized for a forklift, an electric motor car, etc., electric control apparatus of industrial apparatus, driving apparatus for fans and compressors of air conditioners, a control device of a numerically controlled working tool, which are required to control a large electric power generally utilize thyristors since thyristors for large power control can be easily available.

Due to the operating characteristics, the drive voltage drop in the thyristor at the time of ON-state is about 0.7 V to 1.5 V which is higher than that in a transistor, and once it becomes ON it is impossible to render it OFF unless its anode voltage reaches zero. Although OFF control is made possible by using an complicated and expensive control circuit, such circuit accompanies troubles.

A bipolar transistor requires much finer manufacturing technique than a thyristor, and even when a transistor having the same element area as that of a thyristor can be obtained the effective area for current conduction is ⅓ to 1/5 of that of the thyristor so that the heat generated by the transistor increases which renders it unsuitable for large power.

On the other hand, the voltage drop in a transistor at ON-state is 0.5 V or less which is smaller than 0.7 V to 1.5 V of that of the thyristor, and the transistor can readily be turned OFF by applying a negative bias across its base and emitter electrodes. Moreover, when compared with the thyristor the transistor has advantageous feature of high speed operation. Therefore, we have made exhaustive research to obtain a power transistor which has the feature and can control comparable power as the thyristor, and succeeded in obtaining a transistor of this invention.

SUMMARY OF THE INVENTION

Accordingly, it is a principal object of this invention to provide an improved power transistor.

Another object of this invention is to provide a bipolar transistor having lower power loss than a conventional transistor.

Still another object of this invention is to provide an improved power transistor having a lower collector saturation voltage than the prior art transistor at the time of conduction.

A further object of this invention is to provide a transistor capable of being incorporated into an IC (integrated circuit).

To attain these objects, according to this invention, a specific material is used for the collector region of a bipolar transistor such that the forbidden band width of the collector region would be larger than that of the base region layer. With this construction, in case of an NPN transistor, a high potential barrier is formed against holes migrating from the base toward the collector, so that the electron injection efficiency from the collector into the base at saturating state can be improved above that of the conventional transistor, whereby the reverse current gain $\alpha_I$ becomes large, resulting in smaller voltage drop at ON-state. The specific material comprises polycrystalline silicon containing oxygen or amorphous silicon.

According to this invention, there is provided a bipolar transistor of the type comprising an emitter region, a base region and a collector region, characterized in that the collector region has a larger borbidden band gap than that of the base region and made of material having different conductivity type from that of the base region.

DESCRIPTION OF THE PREFERRED EMBODIMENTS

Figure 1:
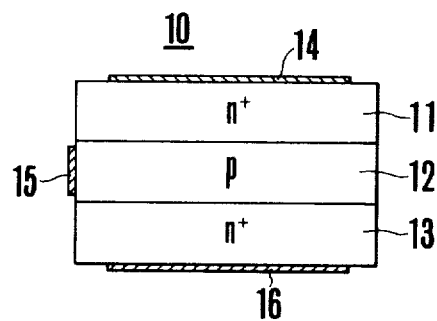
FIG. 1 is a sectional view showing the fundamental construction of a bipolar transistor embodying the invention.

Where a transistor is operated with its emitter grounded, as the saturation voltage between its emitter and collector during conduction is reduced, the power loss of the transistor can be reduced as is well known in the art.

According to a large amplitude operation theory of a transistor, the saturation voltage $V_{CS}$ between the emitter and the collector of an emitter grounded transistor can be approximately shown by the following equation (1)

$$V_{CS} = \frac{kT}{q} \log \frac{\frac{1}{\alpha_I} + \frac{1-\alpha_I}{\alpha_I} \cdot \frac{I_c}{I_b}}{1 - \frac{1-\alpha_N}{\alpha_N} \cdot \frac{I_c}{I_b}} \tag{1}$$

where $I_c$ represents the collector current and $I_b$ the base current, $\alpha_N$ the base grounded circuit gain, and $\alpha_I$ the base grounded reverse current gain when the connections to the emitter and collector electrodes are reversed. Regarding equation (1) reference is made to J. J. Ebers and J. L. Mollis paper entitled "Large Signal Behavior of Junction Transistor", PROCEEDINGS OF IRE, Vol. 42, p 17 61, 1954. As can be noted from equation (1) the saturation voltage $V_{CS}$ decreases as the current gain $\alpha_N$ and the reverse current gain $\alpha_I$ approaches unity. Especially, when a high saturation state ($I_c/I_b \cong 0$) is formed by a large base drive current I, the saturation voltage $V_{CS}$ is determined only by the reverse current gain $\alpha_I$ so that the saturation voltage becomes small as $\alpha_I$ approaches unity. Accordingly, in an application in which the saturation voltage must be low, particularly in a power transistor to which the invention is related it is essential to have a construction according to which the reverse current gain can be made close to unity.

One method of making the reverse current gain $\alpha_I$ close to unity is to make sufficiently high the impurity concentration of the collector than that of the base. Well known germanium alloy type transistor and a silicone single diffused transistor have the construction, and they have smallest saturation voltage among various types of prior art transistors. Even with these transistors, however, the injected carrier concentration in the base region becomes higher if operated under large current so that the minority carrier injection efficiency from the collector into the base decreases thus lowering the reverse current gain $\alpha_I$. Where a high current operation is desired, it becomes necessary to increase the base impurity concentration for the purpose of decreasing the base resistance. This also decreases the reverse current gain $\alpha_I$. As a consequence, with the prior art transistor construction, there has been a limit for the decrease in the saturation voltage.

We have paid particular attention to the injection efficiency of minority carriers at the boundary between the base and the collector. More particularly, we have considered that the decrease in the injection efficiency from the collector to the base at the time of large current operation is caused by the increase in the injection of holes from the base region into the collector region.

To solve this problem we thought that if the number of holes flowing into the collector region from the base region could be limited, it would become possible to efficiently utilize electrons or minority carriers injected from the collector region into the base region, and found that the forbidden band gap of the collector region should be made larger than that of the base region.

As will be described later, preferred materials with a large forbidden band gap are utilized to form the collector region. In this structure a recombination speed of the minority carriers must be low at the boundary between the collector and base regions. The examples are oxygen containing polycrystalline silicone and amorphous silicon. In this case, for the purpose of decreasing the resistivity, polycrystalline silicon or amorphous silicon containing $5 \times 10^{19}$ cm$^{-3}$ of a donor or an acceptor impurity is used. The quantity of oxygen incorporated into the polycrystalline silicon should be higher than 2 atomic % in order to obtain a large effective forbidden band gap and should be less than 50 atomic % in order not to increase the resistivity.

In a transistor utilizing a GaAs base region, mixed crystal of GaAs-AlAs containing more than $1 \times 10^{18}$ cm$^{-3}$ of donor or acceptor impurity is used.

As shown in FIG. 1, the bipolar transistor 10 embodying the invention comprises an N type emitter region layer 11 of a high impurity concentration, a P type base layer 12, and a collector layer 13 of a high impurity concentration, which are layered in the order mentioned. Although in FIG. 1 the transistor is depicted diagrammatically, the base layer 12 and the collector 13 form a hetero junction characterizing the invention, while the collector region layer is made of material having a small recombination speed of the minority carriers at the boundary between the collector layer 13 and the base region layer 12, for example polycrystalline silicon containing oxygen or amorphous silicon. In the transistor shown in FIG. 1, electrodes 14, 16 and 15 are respectively attached to the surface of the N type emitter layer 11, the surface of the collector layer 13 and the side surface of the P type base layer 12.

It is advantageous that the impurity concentration of the N type emitter layer 11 is higher than $5 \times 10^{19}$ cm$^{-3}$, that of the P type base layer 12 is $5 \times 10^{13} - 5 \times 10^{18}$ cm$^{-3}$, and that of the N type collector region 13 is higher than $5 \times 10^{19}$ cm$^{-3}$.

Figure 2:
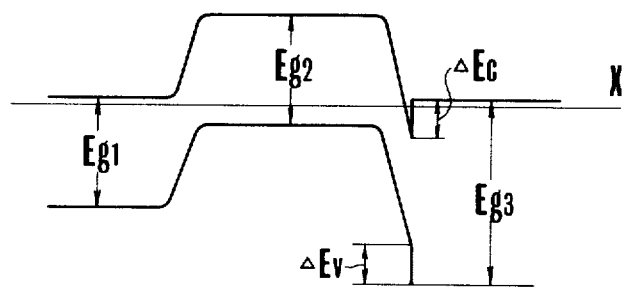
FIG. 2 is an energy level diagram for explaining the relations among the forbidden band gaps of various regions of the transistor shown in FIG. 1.

With this construction as can be noted from the energy level diagrams of layers 11, 12 and 13, the forbidden band gap $E_{g3}$ of the N type collector layer 13 becomes larger than that $E_{g2}$ of the P type base layer 12. In FIG. 2, $E_{g1}$ shows the forbidden band gap of the N type emitter layer 11, $\Delta E_C$ represents a possible discontinuous value appearing at the conduction band between base and collector layers (in the following description the N type emitter layer, the P type base layer, and the N type collector are designated as emitter, base and collector respectively), $\Delta E_V$ represents an excess value of the forbidden band gap, characteristic of the present invention, which occurs due to the larger band gap, appearing at the valence band and X a Fermi level.

In this transistor 10 the discontinuous value $\Delta E_C$ appearing at the conduction band at the hereto junction between the base and collector is equal to the difference of electron affinity between the base and collector, while the discontinuous value $\Delta E_V$ appearing at the valence band is equal to ($E_{g3}-E_{g2}-\Delta E_C$). Due to this discontinuity in the valence value, a high potential barrier would be formed against the holes flowing from the base to the collector, thus preventing the flow of the holes. For this reason, where the base impurity concentration is high and even when the carrier concentration in the base increases at the time of saturation, the electron injection efficiency from the collector into the base would not be lowered with the result that the reverse current gain becomes large, thus decreasing the saturation voltage. In other words, when the forbidden band gap $E_{g3}$ of the collector region is made to be larger than that $E_{g2}$ of the base region as above described it is possible to prevent or substantially limit the holes flowing from the base to the collector. Consequently, even when the discontinuous value $\Delta E_C$ appears at the valence band it is possible to make large the relative difference between the electrons and holes flowing between the base and collector regions. As a consequence, even at the large current operation, it is possible to make large the reverse current gain $\Delta_I$, thereby greatly decreasing the power loss in the transistor.

Figure 3A:
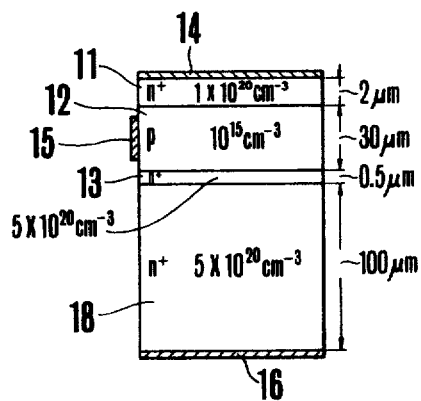
FIG. 3A is a sectional view showing the detail of the construction of a bipolar transistor embodying the invention.
Figure 3B:
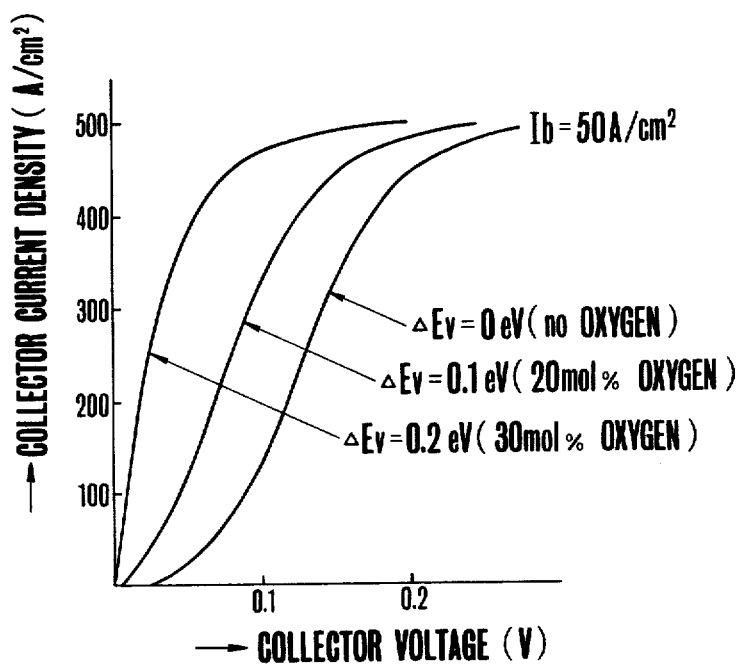
FIG. 3B shows collector voltage versus collector current characteristics of the transistor shown in FIG. 3A and of a prior art transistor.

FIG. 3B shows the $V_S$ versus $I_C$ characteristic of the bipolar transistor of this invention shown in FIG. 3A which shows in more detail transistor 10 shown in FIG. 1 and different therefrom in that a collector reenforcing layer 18 is interposed between the collector layer 13 and the collector electrode. The emitter layer 11 comprises a silicon layer containing $1 \times 10^{20}$ cm$^{-3}$ of phosphorus and a thickness of 2 microns. The base layer 12 comprises a silicon layer containing $10^{15}$ cm$^{-3}$ of boron and having a thickness of 30 microns. The collector layer 13 comprises a polycrystalline silicon layer containing $5 \times 10^{20}$ cm$^{-3}$ phosphorus and 20 mole % ($\Delta E_V = 0.1$ eV) or 30 mole % ($\Delta E_V = 0.2$ eV) of oxygen while the collector reenforcing layer 18 comprises a polycrystalline silicon layer having a phosphorus concentration of $5 \times 10^{20}$ cm$^{-3}$. The collector current versus collector voltage characteristic of a prior art transistor shown in FIG. 3 was obtained from a transistor having the construction shown in FIG. 3A except that the collector layer 13 does not contain oxygen ($\Delta E_V = 0$). As can be noted from the characteristics shown in FIG. 3B, in the transistor of this invention where $\Delta E_V = 0.1$ eV and 0.2 eV the collector current begins to increase at a smaller collector voltage than a case (prior art) where $\Delta E_V = 0$, meaning that the collector saturation voltage at the time of conduction can be made smaller than about 0.2 V of the prior art. From this it can be noted that it is possible to obtain a transistor having lower power loss than the prior art transistor.

We have confirmed that, theoretically it is possible to reduce the collector saturation voltage to be less than 0.01 V.

The method of manufacturing a transistor embodying the invention will be described with reference to FIGS. 4A through 4E.

At first a P type high resistive silicon substrate was prepared having a resistivity of 10 ohm-cm, $1 \times 10^{15}$ cm$^{-3}$ boron, and a thickness of 150 microns. As will be described later, this substrate is used as a base layer. N$^+$ type polycrystalline silicon containing oxygen and an impurity at a high concentration was deposited on one surface of the substrate 21 to a thickness of 0.5 micron to form an N$^+$ collector layer 22 by a hetero junction. The collector layer 22 was formed by the following process. More particularly, a mixed gas of monosilane SiH$_4$, nitrogen monoxide N$_2$O and phosphine PH$_3$ was introduced into a vapor phase growth device and these reactants were caused to react at a temperature of 650° C. by utilizing nitrogen as carrier gas. The ratio of flow quantities of monosilane, nitrogen monooxide and phosphine was SiH$_4$:N$_2$O:PH$_3$ = 1:0.5:0.01. The oxygen content of the polycrystalline silicon was 30 atomic %, and the width of the forbidden band gap as determined by optical absorption method was larger than that of the monocrystalline silicon by 0.25 eV. The valence band gap $\Delta E_g$ between the monocrystalline silicon and the polycrystalline silicone was 0.2 eV.

Figure 4A:
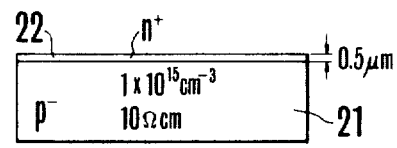
FIGS. 4A through 4E show successive steps of manufacturing the bipolar transistor shown in FIG. 1.
Figure 4B:
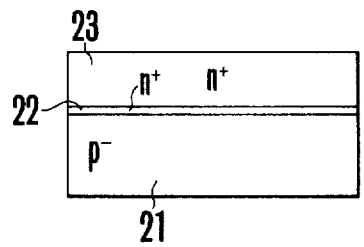
Figure 4C:
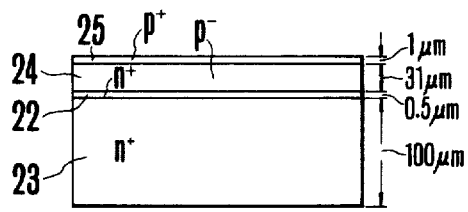

This state is shown in FIG. 4A. As shown, a polycrystalline silicon layer 23 containing $5 \times 10^{20}$ cm$^{-3}$ of a phosphorus was formed on the collector layer 22 to a thickness of 100 microns by a well known method. This state is shown in FIG. 4B. Then the exposed surface of the substrate 21, that is the surface opposite the collector layer 22 was polished to a thickness of 32 microns by a suitable method, thus forming a base layer 24. Then, the exposed surface of the base layer 24 was brought to the upper side and $1 \times 10^{19}$ cm$^{-3}$ of boron was diffused about one micron depth from the exposed surface of the base layer 24 to form a base contact layer 25 over the entire surface of the base layer 24. This state is shown in FIG. 4C.

Then phosphorus was diffused into a selected region of the exposed base layer 24 to form an emitter region 26 having a depth of 2 microns and an impurity concentration of $1 \times 10^{20}$ cm$^{-3}$. This state is shown in FIG. 4D.

Figure 4D:
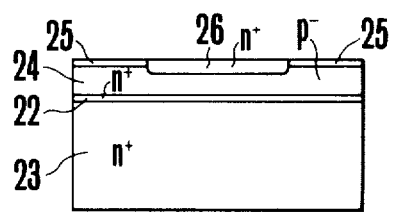
Figure 4E:
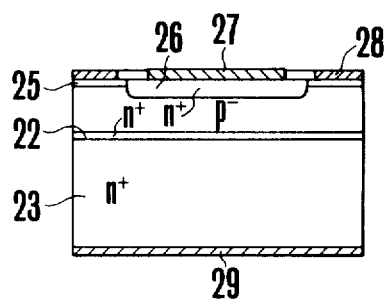

Finally, electrodes 27, 28 and 29 were attached respectively to emitter region 26, base region 21 and collector region 23 to obtain a bipolar transistor of this invention shown in FIG. 4E.

In FIGS. 4D and 4E such well known masking process and interelectrode insulation necessary to form the emitter region and the electrodes are not shown.

In the above described embodiment, the forbidden band gap of the N type emitter region may be made to be larger than that of the P type base region, in which case the emitter region is made of the same material as the collector region, that is polycrystalline silicon containing oxygen.

Figure 5:
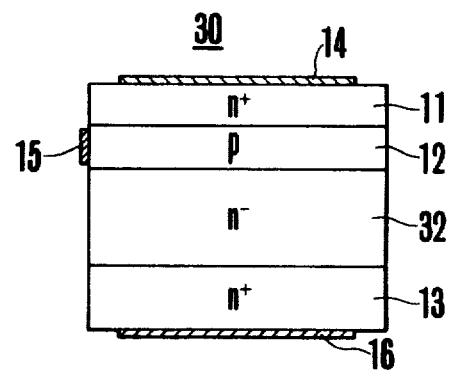
FIG. 5 is a sectional view showing a modification of the bipolar transistor according to this invention.

FIG. 5 illustrates another embodiment of the bipolar transistor of this invention, in which portions corresponding to those shown in FIG. 1 are designated by the same reference charactors. The transistor 30 shown in FIG. 5 comprises an N type emitter layer 11, a P type base layer 12, a collector layer 13 of a high impurity concentration and electrodes 14, 15 and 16 attached to respective layers in the same manner as in FIG. 1. However, it differs from the transistor shown in FIG. 1 in that a high resistivity N$^-$ type layer 32 is interposed between the base layer 12 and the collector 13. This N$^-$ type layer 32 is provided for the purpose of improving blocking voltage and made of silicon having a resistivity of 15 ohm-cm, an impurity (phosphorus) concentration of $3 \times 10^{14}$ cm$^{-3}$ and a thickness of 30 microns.

Figure 6:
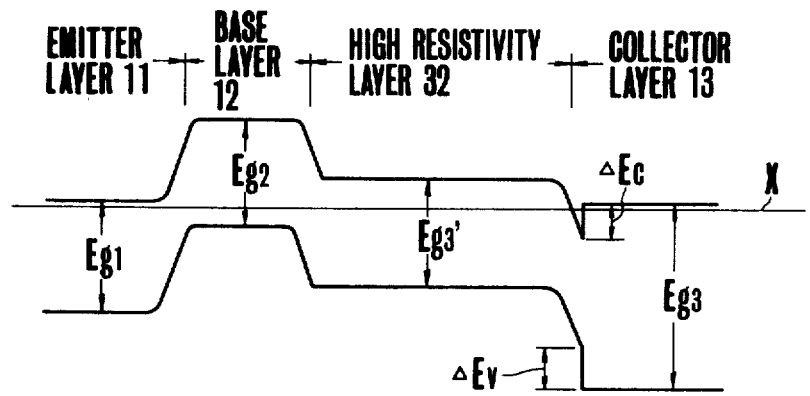
FIG. 6 is an energy level diagram useful to explain the relations among the forbidden band gaps of respective regions of the transistor shown in FIG. 5.

As shown by the collector forbidden diagram shown in FIG. 6, the collector forbidden band gap $E_{g3}$ of the N type collector layer 13 is set to be larger than the base forbidden band gap $E_{g2}$ of the P type base layer 12. (that is $E_{g3} > E_{g2}$).

Furthermore, the forbidden band gap $E_{g3}'$ of the high resistivity N type region 32 is set to be equal to the base forbidden band gap $E_{g2}$ (that is $E_{g3}' = E_{g2}$). The forbidden band width $E_{g3}'$ of the N type laser 33 should not be larger than the base forbidden band gap $E_{g2}$. Because, if the forbidden band gap $E_{g3}'$ is larger than the base forbidden band gap $E_{g2}$, a potential barrier against holes would be formed in the valence band between the base and the high resistance collector so that even when the transistor is brought to a saturated state holes would not be injected into the high resistivity collector from the base with the result that the high resistive layer 32 would not be subjected to a conductivity modulation, thereby increasing the saturation voltages.

In FIG. 6 $\Delta E_C$ represents a discontinuous value appearing at the conduction band between the base and collector, $\Delta E_V$ a discontinuous value appearing at the valence band and X the Fermi level.

In this case, the emitter forbidden band gap $E_{g1}$ may be set to be larger than the base forbidden band gap $E_{g2}$. Again the emitter and base are connected by a hetero junction.

Like transistor 10 shown in FIG. 1, the transistor 30 has a large reverse current gain $\alpha_I$ thus making small the saturation voltage at the ON-state.

Figure 7:
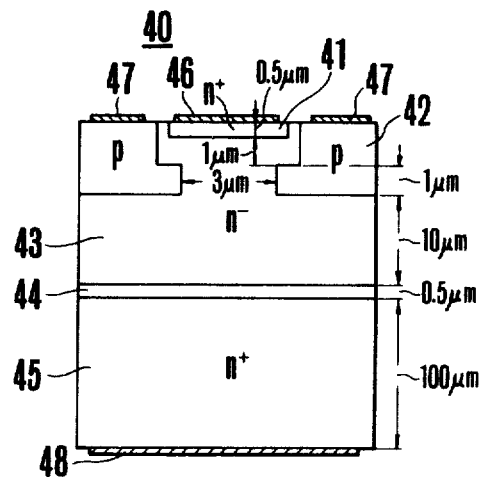
FIGS. 7 and 8 are sectional views showing other embodiments of this invention.

Another embodiment of this invention applied to a depleted base transistor or a bipolar static induction transistor will now be described with reference to FIG. 7. One example of the depleted base transistor is disclosed in H. Iwasaki, O. Ozawa and Y. Sasaki's paper entitled "A depleted base transistor", Proc. 9th Conf. Solid State Devices, Tokyo, 1977, supplement to Japan J. Applied Physics, Vol. 17-1, pp 245, 1978, and one example of the bipolar static induction transistor is disclosed in J. Nishizawa, T. Ohmi, Y. Mochida, T. Matsuyama and S. Iida's paper entitled "Bipolar Mode Static Induction Transistor (BSIT)—High Speed Switching Devices". Int. Electron Devices Mtg. P. 676, 1978. The base of transistor 40 is made of galliium-arsenic (GaAs), for example. The transistor further comprises a high impurity concentration N type emitter region or source 41 made of GaAs containing $5 \times 10^{18}$ cm$^{-3}$ tellurium and P type base region (or gate) 42 made of GaAs containing $1 \times 10^{-}$cm$^{-3}$ cadmium (Cd). These region 41 and 42 are formed in a high resistivity collector region 43 made of GaAs containing $1 \times 10^{14}$ cm$^{-3}$ of tellurium. The base region 42 is formed by a well known method to have a sectional configuration in which the base region 42 surrounds the emitter region 41. The collector lightly doped region 43 is made of GaAs containing $1 \times 10^{14}$ cm$^{-3}$ of tellurium. Beneath the lightly doped collector region 43, an N$^+$ type heavily doped collector region 44 made of Ga$_{0.7}$Al$_{0.3}$ is disposed. This collector region 44 contains $5 \times 10^{18}$ cm$^{-3}$ of tellurium, a high impurity concentration characterized by the invention, and beneath the collector region 44 is disposed a collector reinforcing layer 45 made of GaAs containing $5 \times 10^{18}$ cm$^{-3}$ of tellurium. Electrodes 46, 47 and 48 are attached to respective surfaces of the N type emitter region 41, P type base region 42 and N type collector region 45. The dimensions of respective regions are shown in FIG. 7.

The resistance value of the high resistivity collector region 43 is selected such that when the P type base region 42 and the N type emitter region 41 have the same potential the depletion layer extending from the P type base region 42 to the high resistivity collector region 43 would interrupt the path between the emitter 41 and the collector 44.

Further the forbidden band gap of the N type collector region 44 is made to be larger than that of the P type base region 42, and the forbidden band gap of the high resistivity N type collector region 43 is made to be equal to that of the P type base region 42.

This modified transistor 40 also has a large reverse current gain and can make small the saturation voltage in the same manner as in the transistor 30 shown in FIG. 5.

Figure 8:
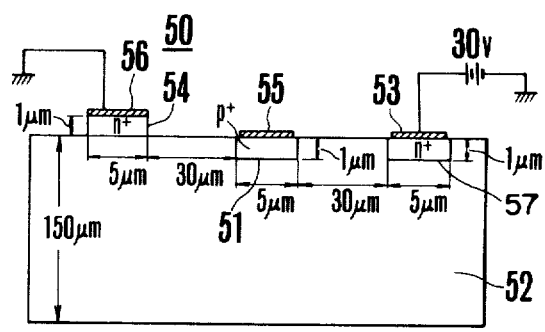

FIG. 8 shows an application of this invention to a conductance transistor, one example thereof being described in T. Sudo, H. Kodama, T. Suzuki and Y. Mizushima's paper of the title "Characteristics of the Conductance Transistors", Trans. IECE of Japan, 55-C, No. 11, P 565, 1972. The transistor 50 shown in FIG. 8 comprises an N type silicon substrate or an N type base region 52 having a resistivity of 30 ohm-cm and containing $2 \times 10^{14}$ cm$^{-3}$ of phosphorus, and a P$^+$ type emitter region of a high impurity concentration, that is containing $5 \times 10^{18}$ cm$^{-3}$ of boron and formed by diffusing boron into a predetermined region of the N type base region 52. A phosphorus diffused layer 57 (impurity concentration of $1 \times 10^{20}$ cm$^{-3}$) is also formed in the N type base region 52 and a base electrode 53 is attached to the layer 57. According to this invention an N$^+$ type collector region 54 is made of amorphous silicon and containing $1 \times 10^{20}$ cm$^{-3}$ of phosphorus as an impurity, and a collector electrode 56 is attached to the collector region 54. An emitter electrode 55 is applied to the surface of the P type emitter region 51.

In the same manner as in the previous embodiments, the forbidden band gap of the N type collector layer 54 is made to be larger than that of the N type base layer 52 to provide a hereto junction therebetween. Typical dimensions of this transistor is shown in FIG. 8.

The amorphous silicon used to form the collector is prepared by the following method. This amorphous silicon contains hydrogen and formed by decomposing silane SiH$_4$ in glow discharge. Argon was used as a carrier gas and admixed with the silane at a ratio of SiH$_4$/Ar=0.1. The gas pressure was 1 Torr and the speed of growth was 1 micron/hr. Phosphine PH$_3$ was incorporated into the gas to effect N$^+$ type doping. The amorphous silicon thus obtained contains about 15% by atomic ratio of hydrogen and has a resistivity of less than 2 ohm-cm. The forbidden band gap determined by optical absorption method was higher by 0.15 eV than that of monocrystalline silicon.

Figure 9:
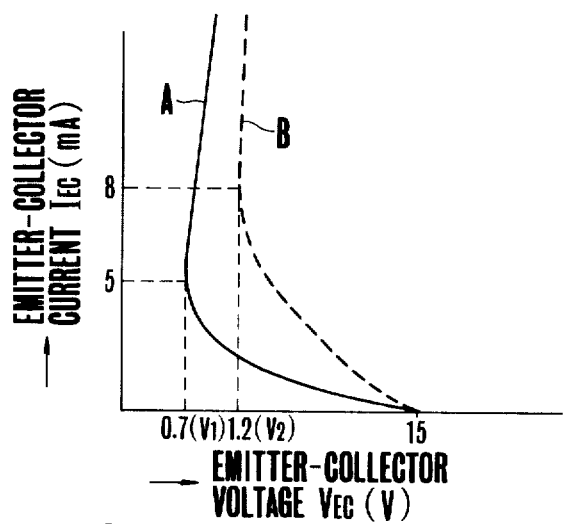
FIG. 9 shows voltage versus current characteristics between emitter and collector of the transistor shown in FIG. 8 and of a prior art transistor.

The relation between the emitter-collector voltage V$_{EC}$ and the emitter-collector current I$_{EC}$ of this transistor 50 is shown by a curve A shown in FIG. 9, while that of a prior art transistor is shown by a curve B. As can be noted from these curves the emitter-collector saturation voltage V$_1$ of transistor 50 is lower than that V$_2$ of the prior art transistor. Curve A was obtained when the emitter voltage was varied while the electrode 56 is grounded and 30 V was applied to the electrode 57.

Figure 10:
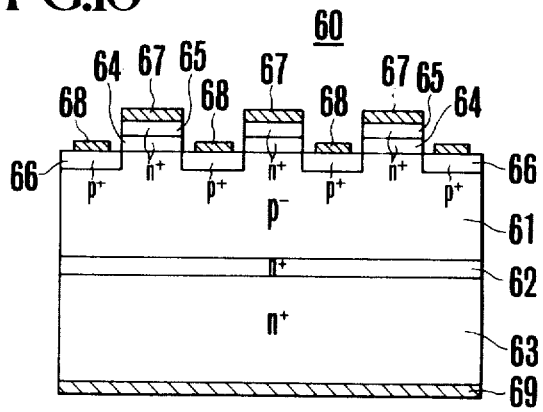
FIG. 10 is a sectional view showing still another embodiment of this invention.

FIG. 10 shows still another embodiment of this invention.

To the lower surface of a P type base region 61 made of P type monocrystalline silicon having a resistivity of 20 ohm-cm, a borom impurity concentration of $7 \times 10^{14}$ cm$^{-3}$, and a thickness of 70 microns was deposited N$^+$ type polycrystalline silicon containing oxygen having a high impurity concentration of $1 \times 10^{<}$cm$^{-3}$ to a thickness of 0.5 micron to form an N type collector region 62 having a large forbidden gap than that of the P type base region 61. The N$^+$ type collector region 62 was formed by introducing into a vapor phase growth device a gas mixture of monosilane SiH$_4$, nitrogen monoxide N$_2$O and phosphine PH$_3$ and heated to 650° by using nitrogen as a carrier gas. The ratio of monosilane, nitrogen monooxide and phosphine was SiH$_4$:N$_2$O:PH$_3$=1:0.5:0.01. The quantity of oxygen contained in the monocrystalline silicon was 30 atomic %, and the forbidden band gap obtained by optical absorption method was higher by 0.25 eV than that of the monocrystalline silicon.

For the purpose of reenforcing the wafer, N$^+$ type polycrystalline silicon containing $10^{21}$ cm$^{-3}$ of phosphor was deposited to a thickness of 150 microns at a temperature of 650° C. to obtain a reenforcing layer 63. The thickness thereof may be in a range that does not increase the series resistance of the collector.

Then an N type polycrystalline layer 64 of a high impurity concentration and containing oxygen was formed to a thickness of 0.5 micron on the surface of substrate opposite to the P type base region 61 by the same process as the collector 62. An N$^+$ type polycrystalline silicon layer 65 of high impurity concentration was deposited on the surface of the layer 64 to a thickness of 2.5 microns for the purpose of improving contact with an electrode.

Then polycrystalline silicon layers 64 and 65 of predetermined shapes were formed by well known photoetching technique and boron ions were implanted into the exposed surface of the P type base region 61 to form a P$^+$ type diffused region of the base contact. The depth of diffusion of the P type diffused region 66 was 1 micron and its impurity concentration was $2 \times 10^{19}$cm$^{-3}$.

Then, the assembly was heat-treated at a temperature of 1000° C. for 20 minutes to set the resistivity of the oxygen containing polycrystalline silicon to be less than 1.0 ohm-cm and thereafter an emitter electrode 67, a base electrode 68 and collector electrode 69 were formed to obtain the transistor 60.

The transistor 60 thus formed has a base-collector blocking voltage of 400 V and a collector-emitter blocking voltage of 270 V. When the collector current density is 300 A/cm$^2$, an emitter grounded current gain was 230 ($\alpha_N=0.9957$) at the time of non-saturation. A reverse emitter grounded current gain was 120 ($\alpha_I=0.9917$) at the same current density. When the transistor was drived into a saturated state under which the emitter grounded current gain decreases to 5 at 300 A/cm$^2$, the saturation voltage was 0.093 V.

A prior art transistor identical to transistor 10 shown in FIG. 10 except that the N type collector region 62 is omitted, had a reverse emitter grounded current gain of 20 ($\alpha_I=0.9524$) under the same current density, and a saturation voltage of 0.210 V.

As above described in the transistor of this invention as the forbidden band gap of the collector region is made to be larger than that of the base region, it is possible to reduce the saturation voltage and power loss at the time of conduction.

While the invention has been described in terms of several specific embodiments, it should be understood that the intention is not limited to these embodiments and that many changes and modifications may be made without departing from the spirit and scope of the invention as defined in the appended claims.

What is claimed is:

1. In a bipolar transistor of the type comprising an emitter region, a base region and a collector region, the improvement wherein said collector region has a larger forbidden band gap than that of said base region and is made of material having different conductivity type from that of said base region and further comprising a high resistivity semiconductor region interposed between said base region said collector region, said high resistivity semiconductor region having the same conductivity type as said collector region, a lower impurity concentration than said collector region and the same forbidden band gap as that of said base region.

2. The bipolar transistor according to claim 1 wherein said emitter region, said base region and said collector region and layered in the order mentioned.

3. The bipolar transistor according to claim 1 wherein each of said emitter, base and collector regions are respectively provided with an emitter, base and collector electrode.

4. The bipolar transistor according to claim 3 which further comprises a collector reinforcing semiconductor layer interposed between said collector region and said collector electrode and having the same conductivity type as said collector region.

5. The bipolar transistor according to claim 1 wherein said emitter region and said base region are interconnected through a hereto junction and wherein said emitter region is made of material having a larger forbidden band gap than that of said base region.

6. The bipolar transistor according to claim 1 wherein said emitter and collector regions are made of polycrystalline silicon or amorphous silicon containing oxygen.

7. The bipolar transistor according to claim 6 wherein said collector region comprises polycrystalline silicon containing 2 to 50 atomic % of oxygen and a donor or acceptor impurity of a concentration higher than $5 \times 10^{19}$ cm$^{-5}$.

8. The bipolar transistor according to claim 6 wherein said collector region is made of amorphous silicon containing a donor or an acceptor impurity of a concentration higher than $5 \times 10^{19}$ cm$^{-3}$.

9. The bipolar transistor according to claim 1 wherein said base, emitter and collector regions are made of a mixed crystal of GaAs-AlAs.

10. The bipolar transistor according to claim 9 wherein said collector region is made of a mixed crystal of GaAs-AlAs containing $1 \times 10^{18}$ cm$^{-3}$ of an impurity.

* * * * *